(12) United States Patent
Wong et al.

(10) Patent No.: US 7,268,809 B2
(45) Date of Patent: Sep. 11, 2007

(54) ANALOG BUFFER MEMORY FOR HIGH-SPEED DIGITAL IMAGE CAPTURE

(75) Inventors: Sau C. Wong, Hillsborough, CA (US); Leo Petropoulos, San Jose, CA (US)

(73) Assignee: San Disk Corporation, sunnyvale, CA (US)

( * ) Notice: Subject to any disclaimer, the term of this patent is extended or adjusted under 35 U.S.C. 154(b) by 0 days.

(21) Appl. No.: 09/159,397

(22) Filed: Sep. 23, 1998

(65) Prior Publication Data

US 2003/0058355 A1    Mar. 27, 2003

(51) Int. Cl.
*H04N 5/76* (2006.01)
(52) U.S. Cl. .................. 348/231.7; 348/207.1
(58) Field of Classification Search ............. 348/207.1, 348/207.11, 231.99, 231.7, 231.9; 711/115; 365/185.22, 185.11
See application file for complete search history.

(56) References Cited

U.S. PATENT DOCUMENTS

| | | |
|---|---|---|
| 3,719,922 A | 3/1973 | Lopes, Jr. et al. |
| 3,927,308 A | 12/1975 | Summers et al. |
| 4,038,685 A | 7/1977 | Bazin |
| 4,057,830 A | 11/1977 | Adcock |
| 4,131,919 A | 12/1978 | Lloyd et al. |
| 4,420,773 A | 12/1983 | Toyoda et al. |
| 4,445,189 A | 4/1984 | Hyatt |
| 4,456,931 A | 6/1984 | Toyoda et al. |
| 4,602,291 A | 7/1986 | Temes |
| 4,614,966 A | 9/1986 | Yunoki et al. |
| 4,803,554 A | 2/1989 | Pape |
| 4,875,098 A | 10/1989 | Yamamoto et al. |
| 4,989,179 A * | 1/1991 | Simko .................. 365/185.22 |
| 5,034,804 A | 7/1991 | Sasaki et al. |
| 5,047,861 A | 9/1991 | Houchin et al. |
| 5,049,983 A | 9/1991 | Matsumoto et al. |
| 5,055,930 A * | 10/1991 | Nagasaki et al. ........... 348/317 |
| 5,155,584 A | 10/1992 | Taguchi et al. |
| 5,164,915 A * | 11/1992 | Blyth .................... 365/185.03 |
| 5,264,944 A | 11/1993 | Takemura |
| 5,272,535 A * | 12/1993 | Elabd ......................... 348/317 |
| 5,274,457 A | 12/1993 | Kobayashi et al. |
| 5,280,358 A * | 1/1994 | Yushiya et al. ............. 348/247 |
| 5,289,286 A | 2/1994 | Nakamura et al. |
| 5,295,077 A | 3/1994 | Fukuoka |
| 5,295,485 A * | 3/1994 | Shinomura et al. ......... 600/443 |
| 5,317,407 A | 5/1994 | Michon |
| 5,339,275 A | 8/1994 | Hyatt |
| 5,519,654 A * | 5/1996 | Kato et al. ............. 365/185.11 |
| 5,541,653 A | 7/1996 | Peters et al. |

(Continued)

FOREIGN PATENT DOCUMENTS

EP    0 798 739 A2    10/1987
JP    06036578 A1 *    2/1994

*Primary Examiner*—Thai Tran
*Assistant Examiner*—Jason Whipkey
(74) *Attorney, Agent, or Firm*—Parsons Hsue & de Runtz LLP

(57) ABSTRACT

A digital imaging system uses a high density, high speed analog/multi-level memory to temporarily store image data at high rates for extended periods of time. A portion of the stored data is transmitted for image processing and compression. When image processing and compression on the data are completed, another portion of the stored data is transmitted for processing. As a result, high speed image capture for extended periods is possible because the processing speed of the image processing and compression no longer limit the time required between high speed bursts or the length of a high speed burst.

24 Claims, 10 Drawing Sheets

U.S. PATENT DOCUMENTS

| | | | |
|---|---|---|---|
| 5,576,757 A * | 11/1996 | Roberts et al. | 348/220.1 |
| 5,576,759 A * | 11/1996 | Kawamura et al. | 348/207.99 |
| 5,585,846 A | 12/1996 | Kim | |
| 5,606,365 A | 2/1997 | Maurinus et al. | |
| 5,619,445 A | 4/1997 | Hyatt | |
| 5,625,583 A * | 4/1997 | Hyatt | 365/183 |
| 5,644,636 A * | 7/1997 | Fernandez | 711/163 |
| 5,680,341 A * | 10/1997 | Wong et al. | 365/45 |
| 5,687,115 A * | 11/1997 | Wong et al. | 365/185.11 |
| D389,501 S | 1/1998 | Mascarenas, Sr. et al. | |
| 5,739,850 A | 4/1998 | Hori | |
| 5,745,409 A | 4/1998 | Wong et al. | |
| 5,760,727 A * | 6/1998 | Lin | 348/362 |
| 5,777,923 A * | 7/1998 | Lee et al. | 365/185.11 |
| 5,784,018 A * | 7/1998 | Ohmi et al. | 341/136 |
| 5,818,757 A | 10/1998 | So et al. | |
| 5,867,430 A * | 2/1999 | Chen et al. | 365/185.11 |
| 5,901,086 A * | 5/1999 | Wang et al. | 365/185.21 |
| 5,910,913 A | 6/1999 | Kato et al. | |
| 5,923,585 A | 7/1999 | Wong et al. | |
| 5,969,986 A * | 10/1999 | Wong et al. | 365/185.11 |
| 6,011,714 A * | 1/2000 | Shibata et al. | 365/185.22 |
| 6,081,294 A * | 6/2000 | Cooper | 348/221.1 |
| 6,104,437 A | 8/2000 | Taira et al. | |
| 6,134,145 A * | 10/2000 | Wong | 365/185.11 |
| 6,172,935 B1 * | 1/2001 | Wright et al. | 365/194 |
| 6,175,937 B1 * | 1/2001 | Norman et al. | 365/185.03 |
| 6,177,956 B1 * | 1/2001 | Anderson et al. | 348/207.99 |
| 6,282,462 B1 | 8/2001 | Hopkins | |
| 6,433,823 B1 | 8/2002 | Nakamura et al. | |
| 6,487,116 B2 | 11/2002 | Khan et al. | |
| 6,594,036 B1 * | 7/2003 | Wong et al. | 348/254 |
| 2001/0010551 A1 | 8/2001 | Dierickx | |

* cited by examiner

ANALOG BUFFER MEMORY FOR HIGH-SPEED DIGITAL IMAGE CAPTURE

BACKGROUND OF THE INVENTION

1. Field of the Invention

This invention relates to digital image signal processing and, in particular, to digital imaging structures and processes using an analog buffer memory.

2. Description of Related Art

Digital image processing can be used to convert an optical image to electronic image data, which is then converted to digital data for display or storage on a recording medium, such as a memory card. The stored digital data can later be retrieved to reproduce the image on a display device, such as a computer monitor, or on a hard copy medium, such as a color printer or photographic film.

FIG. 1 is a block diagram of a digital image processing system, in particular, a digital still camera (DSC) 100. DSC 100 includes an image sensor 110, such as a CMOS sensor or a charge-coupled device (CCD), pre-processing circuitry 115, an analog-to-digital (A/D) converter 120, an image processor and compressor 130, a digital memory device 140, read and interface circuitry 150, a liquid crystal display (LCD) 155, and external digital displays, such as a color LCD (not shown) or an external digital memory card 160. Generally, the image of an object is electrically processed by image sensor 110, which converts reflected light from the object into electrical signals, such as voltages.

The analog-to-digital (A/D) converter 120 then samples the analog signal and converts the signal into digital data. Some advantages of digitized information include processing flexibility and higher signal to noise ratio during transmission to reduce error rates and improve picture quality. However, digital data can require very large memory storage capacities and transmission bandwidths.

For example, typical VGA images have a spatial resolution of approximately 307K pixels/frame (i.e., 480 rows with 640 samples or pixels per row). In a digital image, the image is captured, processed, stored, and transmitted as an array of numerical values. The image is divided up into squares in a grid, with each square in the grid referred to as a pixel or sample. The intensity of the image at each pixel is translated into a numerical value which is stored in the array. If the pixel has one of the primary colors (i.e., R, G, B) to be sampled with 8 bits resolution, then there are approximately 2.5 Mbits of data per frame (307K*8), which requires approximately 307 Kbytes of memory storage capacity to store the sampled image. Furthermore, if a digital still camera (DSC) is required to capture 1 frame/sec, a data transmission rate or bandwidth of approximately 2.5 Mbits/sec is needed for a color image. Depending on the number of pixels per frame and the image processing and compression circuits, the memory storage and bandwidth requirements can be much higher than 307 Kbytes and 2.5 Mbits/sec, respectively.

In particular, it may be desirable for digital still cameras to capture images at a high rate, i.e., in "burst mode", for situations where frames are shot in rapid succession, such as during sporting events. For example, if a burst mode requires that 5 frames/sec be captured for high quality images of 2.0 Mbits/frame, then a minimum transmission rate or bandwidth of approximately 80 Mbits/sec or 80 MHz is needed. Further, if this burst mode is sustained for 5 seconds, then the storage capacity of the memory would need to be approximately 400 Mbits. Such large memories and bandwidths are either impractical or may require high capacity memory devices and very high speed circuit elements with parallel processing which can make the digital processing system complicated and very costly. Such a system can also require large amounts of power and board space.

Thus, the large memory storage and channel capacity requirements for digital image transmission and storage make it desirable to reduce the amount of digital data from A/D converter 120. By reducing the amount of data, the transmission bandwidth and/or the memory storage requirements are reduced. A well-known technique is to utilize image processing and compression circuits 130 to reduce the amount of digital data while storing enough data in memory to maintain a desired quality or resolution of the image. Image processing and compression circuits 130 can use common techniques, such as JPEG or run-length coding, to take advantage of the fact that certain pixel values tend to be highly redundant, such as with neighboring individual pixels or neighboring frames. Image processing and compression techniques, e.g., having compression ratios ranging from 4:1 to 20:1, can significantly reduce the number of bits required to represent images by removing these redundancies while still maintaining an acceptable quality of the reconstructed image.

After image processing and compression, the reduced digital data can be stored in a digital memory device 140, such as a memory card having a Flash EEPROM. Read and interface circuits 150 then access the desired image data from the memory device 140 and transmit the data to desired digital destinations, such as an LCD display 155, an external memory card 160, or a hard disk drive (HDD) in a PC (not shown). For example, with a digital still camera, elements 110 to 155 are typically embedded within the body of the digital camera so that digital memory 160 can be a memory card which is removable from the camera and available for subsequent processing of the stored image data. Data in the removed memory card can also be downloaded to a PC HDD or a kiosk for printing, used for later retrieval, or transmission through the Internet.

Thus, with image compression, smaller memories and lower transmission rates are possible. However, image processing and compression also require substantial amounts of time for performing complex and lengthy computations, which can adversely increase the minimum time delay between successive picture frames and/or burst rates. A high burst rate, which allows pictures to be taken in rapid succession, is an important consideration for high-speed professional and high-end, as well as typical, consumer cameras. At present, the duration that a digital camera can sustain for a high burst rate capture is very limited, e.g., typically two seconds or more between successive frames, due to the time required for image processing and compression. Furthermore, cameras capable of high speed image capture are typically high-end professional cameras with electronic drives and a large amount of memory, which can be large and expensive and make such systems undesirable for the typical consumer market.

Accordingly, a simple, low-cost and high quality digital imaging system for high speed image capture is desired which overcomes the problems discussed above with the conventional systems.

SUMMARY

In accordance with an aspect of the present invention, a digital imaging system, and in particular a digital still camera (DSC), incorporates a non-volatile high density, high speed analog/multi-level memory to quickly store a large amount of image data from an image sensor. The stored analog data is then held in the analog/multi-level memory and transmitted in portions to image processing and compression circuits. As a result, sustained high speed image capture is possible because the rate and duration of the image capture is no longer limited by the low speed constraints of image processing and compression.

The data from the analog memory can be directly transmitted to analog devices, such as an analog display, analog printer, or external analog memory card, or to an on-chip analog-to-digital (A/D) converter for conversion to digital data. Once the image data is converted to a digital format, the data can be processed for any number of desired digital destinations, such as image processing and compression circuits. The data can also be downloaded to a hard disc drive (HDD) for permanent storage or editing by photo-enhancement software, transmitting through the Internet, or writing into removable memory cards (e.g., Sandisk's Compact Flash, Toshiba's Smart Media Card, or Sony's newly-introduced Memory Stick).

In other embodiments, the analog/multi-level memory is removed from the body of a digital still camera and placed in a removable analog memory card, external to the camera. Image processing and compression can then take place either within the camera, as before, or outside the camera, e.g., in a PC through suitable software. Alternatively, an imaging system can eliminate A/D conversion so that bursty images stored in the removable analog memory can be transmitted to and reproduced directly in analog destinations such as analog display devices and analog printers. Such an imaging system can also be configured to accept a digital memory card, which accesses the analog data from the pre-processing circuitry and performs A/D conversion and image processing and compression within the card for digital destinations. For video, analog image data from pre-processing circuitry can be transmitted to an NTSC/PAL interface circuit, either inside or outside the DSC, for conversion to the proper format and then stored in the analog/multi-level memory until desired. Thus, short videos (e.g., less than one minute) can be stored for later playback. Videos lasting more than a minute are also possible with higher density memories.

Different types of analog memories can be used to store the analog data, with the type depending on the application and source of the image and/or the display. For example, for applications requiring a high bandwidth, such as high resolution digital still cameras which require high bandwidths in order to minimize the time delay between consecutive exposures, data needs to be stored and read out at very high rates. Accordingly, the analog memory must be of a type capable of meeting these needs.

One type of non-volatile high density, high speed memory has multiple write pipelines that are sequentially started on programming operations and has a shared charge pump that supplies drain-to-source currents during the programming operations. With sequential starts, the programming operations are staggered, which allows a high data rate because all of the write pipelines can operate at the same time to provide the same data rate as a conventional memory that performs parallel programming operations. The staggered operation also prevents the peak current for the multiple programming operations from occurring at the same time. Accordingly, sequential starting of programming operations in the write pipelines avoids the high combined peak current that occurs in memories that simultaneously start multiple programming operations. The smaller peak current allows the charge pump and associated voltage regulation circuitry to be smaller than similar circuitry used in conventional memory that performs parallel programming operations.

One embodiment of a non-volatile semiconductor memory includes multiple write pipelines, a shared charge pump, and a timing circuit. Each of the write pipelines includes an array of non-volatile memory cells and a write circuit coupled to the associated array. When started on a programming operation for a selected memory cell in the associated array, a write circuit applies a programming voltage to the selected memory cell to drive a current through the selected memory cell, for example, to cause channel hot electron injection which raises a threshold voltage in the selected memory cell. The charge pump generates the programming voltage from a supply voltage and supplies the programming voltage to all of the write pipelines for the programming operations. The timing circuit sequentially starts the programming operations by the write circuits. Accordingly, at most one write pipeline at a time requires the maximum programming current from the charge pump, and the charge pump and any associated voltage regulation circuitry can be smaller than that required in a memory that simultaneously starts multiple programming operations. The shared charge pump and sequential starting of programming operations can be beneficially employed in an analog/multi-level memory.

Each write pipeline may additionally include selection circuitry that selects a voltage applied to the selected memory cell during programming. The selection circuitry selects the programming voltage for changing the threshold voltage of the selected memory cell during a series of programming cycles and selects a second voltage for testing the threshold voltage of the selected memory cell during a series of verify cycles. The programming operation in a pipeline ends when a verify cycle determines that the threshold voltage of the selected cell reaches its target level. The write pipelines can be divided into two banks, a bank of even numbered pipelines and a bank of odd numbered pipelines, such that when a programming operation in an even pipeline overlaps a programming operation in an odd pipeline, the even pipeline performs programming cycles and verify cycles when the odd pipeline respectively performs verify cycles and programming cycles. The interleaving programming and verify cycles in this fashion cuts the peak and average current requirement in half because at most one half of the write pipelines draw current from the charge pump at a time. Alternatively, the pipelines can be partitioned into three or more banks where each bank starts programming cycles at a different time. Analog memories of these types can accommodate the very high bandwidths required for certain typical and high-end applications, such as digital still cameras requiring continuous high speed image capture for an extended time period.

This invention will be more fully understood upon consideration of the detailed description below, taken together with the accompanying drawings.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with one embodiment of the invention, a digital imaging system uses a high speed, high density analog/multi-level memory to store analog and/or multiple bits of data during a burst mode. The stored analog data is then retrieved and converted to digital data for further image processing and compression. The high speed, high density analog/multi-level memory first quickly stores the large amounts of analog image data from a long sustained burst mode. Then the memory transmits a first portion of the data for image processing and compression. After this first portion is processed, another portion can be transmitted for processing. Therefore, high-rate digital image capture can be sustained for longer periods of time because the captured images are temporarily stored in the analog/multi-level memory until processing and compression are possible.

Figure 1:
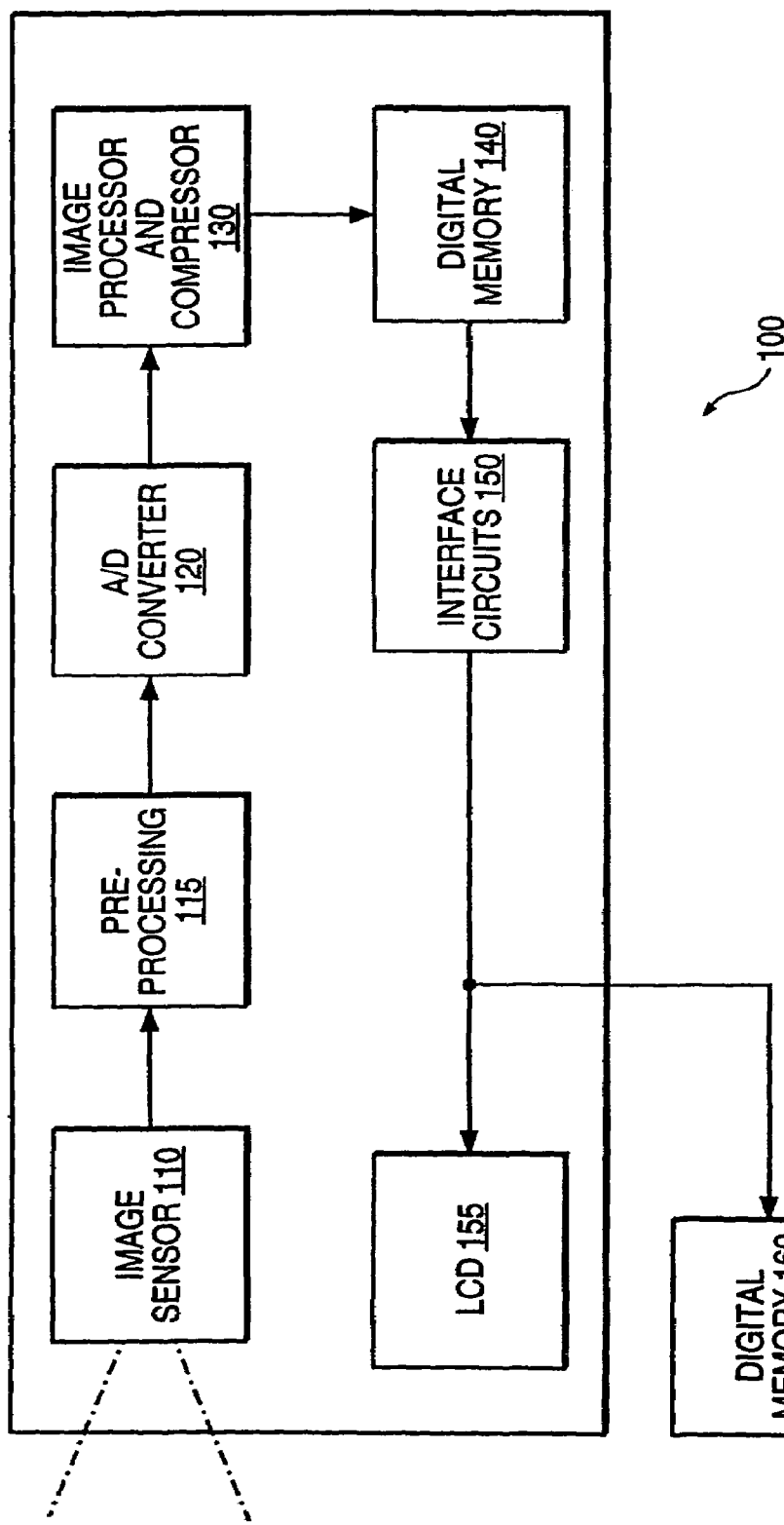
FIG. 1 is a block diagram of a conventional digital imaging system.
Figure 2:
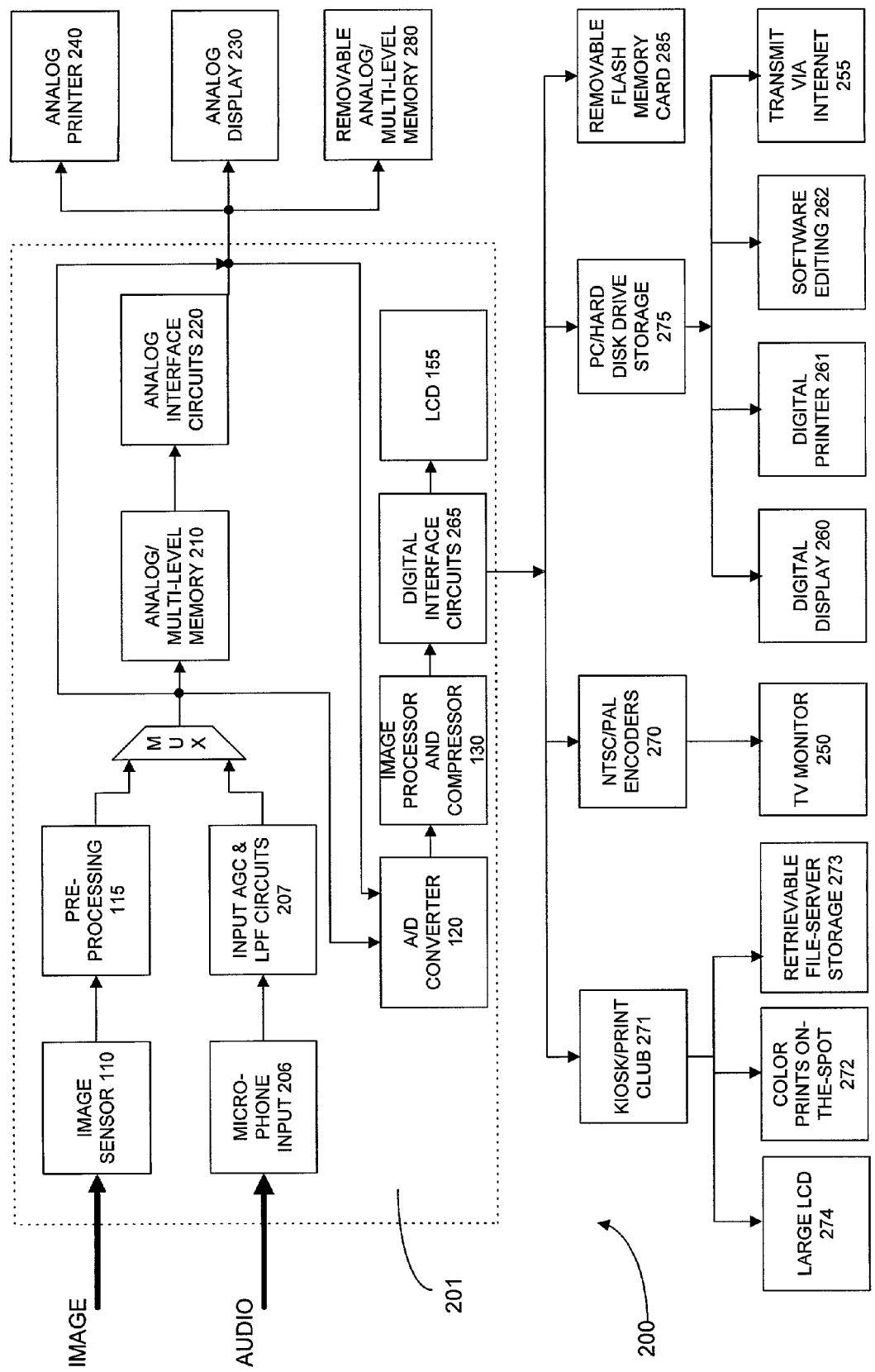
FIG. 2 is a block diagram of a digital imaging system according to one embodiment of the present invention.

FIG. 2 is a block diagram of one embodiment of a digital imaging system 200 according to the present invention. Image sensor 110 first converts an image to electrical signals, such as voltages. Image sensor 110 can be, for example, a charge-coupled device (CCD), a CMOS device, a vidicon tube, or any other suitable image sensing device which converts the light falling on it from an image into an electrical signal. For example, in a CCD, as more light falls onto photoelectric elements, such as photodiode cells, of a CCD, more charge accumulates in the cells. The CCD is constructed such that the photodiodes, which convert the intensity of light into an electric charge, are arranged in a matrix. The electric charge generated in each element is transferred in vertical and horizontal directions. After an integration period, the charge is read out from the cells and processed in analog signal pre-processing circuitry 115. Note that a timing circuit (not shown) can be coupled to a lens assembly or image sensor 110 to control the frequency that images are processed by the image sensor 110. Also, a lens circuit (not shown) can be used to measure the brightness of the object and set a corresponding diaphragm value and shutter speed for the lens assembly. Furthermore, a strobe lamp can be flashed in conjunction with the image exposure to further illuminate the object.

Analog pre-processing circuitry 115 processes the captured image from image sensor 110. The pre-processing circuitry 115 can include a correlated double sampling (CDS) circuit, a gain adjust circuit, and an offset adjust circuit (all not shown for simplicity) and can be used to perform various functions such as CDS for reduction of low frequency read-out noise from the image sensor and offset of sense amplifiers, color filter array (CFA) interpolation algorithms for color, gamma correction, white balancing, and automatic gain control (AGC) for optimizing the dynamic range for analog/multi-level storage. The pre-processed image signal is converted to a voltage for storage in a high density, high speed analog/multi-level memory 210, such as disclosed in commonly-owned U.S. patent application Ser. No. 09/103,623, entitled "HIGH-BANDWIDTH READ AND WRITE ARCHITECTURES FOR NON-VOLATILE MEMORIES", filed Jun. 23, 1998 to Wong et al., Ser. No. 09/128,225, entitled "HIGH DATA RATE WRITE PROCESS FOR NON-VOLATILE FLASH MEMORIES", filed Aug. 3, 1998 to Wong, and Ser. No. 09/086,785, entitled "ANALOG/MULTI-LEVEL MEMORY FOR DIGITAL IMAGING", filed May 28, 1998 to Wong et al., and in commonly-owned U.S. Pat. No. 5,680,341, entitled "PIPELINED RECORD AND PLAYBACK FOR ANALOG NON-VOLATILE MEMORY", filed Jan. 16, 1996, issued Oct. 21, 1997 to Wong et al., all of which are incorporated by reference in their entirety. One pixel of image data with at least 8-bit resolution or at least 256 levels can be stored in each memory storage element in the memory 210.

In addition to image signals, other types of signals can also be stored in analog/multi-level memory 210 depending on the application, such as voice signals from a microphone of an audio/video recorder or time and date stamps from digital cameras. FIG. 2 shows audio signals processed through a microphone 206 and input AGC and low pass filter (LPF) circuits 207 for storage in analog/multi-level memory 210. Remaining blocks for audio processing, which are well-known in the art, are omitted for simplicity.

For high rate image capture (burst mode) in which frames are shot in rapid succession (i.e., for a digital still camera), analog/multi-level memory 210 must have a high storage capacity to store the large amounts of data from image sensor 110 and pre-processing circuitry 115. The analog/multi-level memory 210 must also be fast enough to sample the voltage from image sensor 110 and pre-processing circuitry 115 to meet bandwidth requirements of the imaging source and read at a rate sufficient to meet the requirements of desired destination devices. The longer a burst mode is to be sustained, the higher the storage and speed requirements become for the analog/multi-level memory 210.

One embodiment of a suitable memory performs pipelined writes that stagger the starts of channel hot electron injection processes. The pipelined write scheme provides a high data rate by programming multiple memory cells at a time. However, the programming operations do not start or end simultaneously and are at different stages of completion. A single charge pump supplies a high voltage that drives drain-to-source currents for programming processes such as channel hot electron injection in multiple memory cells. Since the programming operations have staggered starts, the maximum current that the charge pump must provide is less than the peak current for a single programming operation times the number of memory cells being simultaneously programmed. Accordingly, at a fixed data rate, the charge pump required for the pipelined write scheme can be smaller than the charge pump required for a parallel write scheme that starts multiple programming operations simultaneously. Further, staggering the starts of programming operations smoothes the current drawn for the write operation and reduces noise that could disturb the accuracy of the analog write operation.

Figure 3:
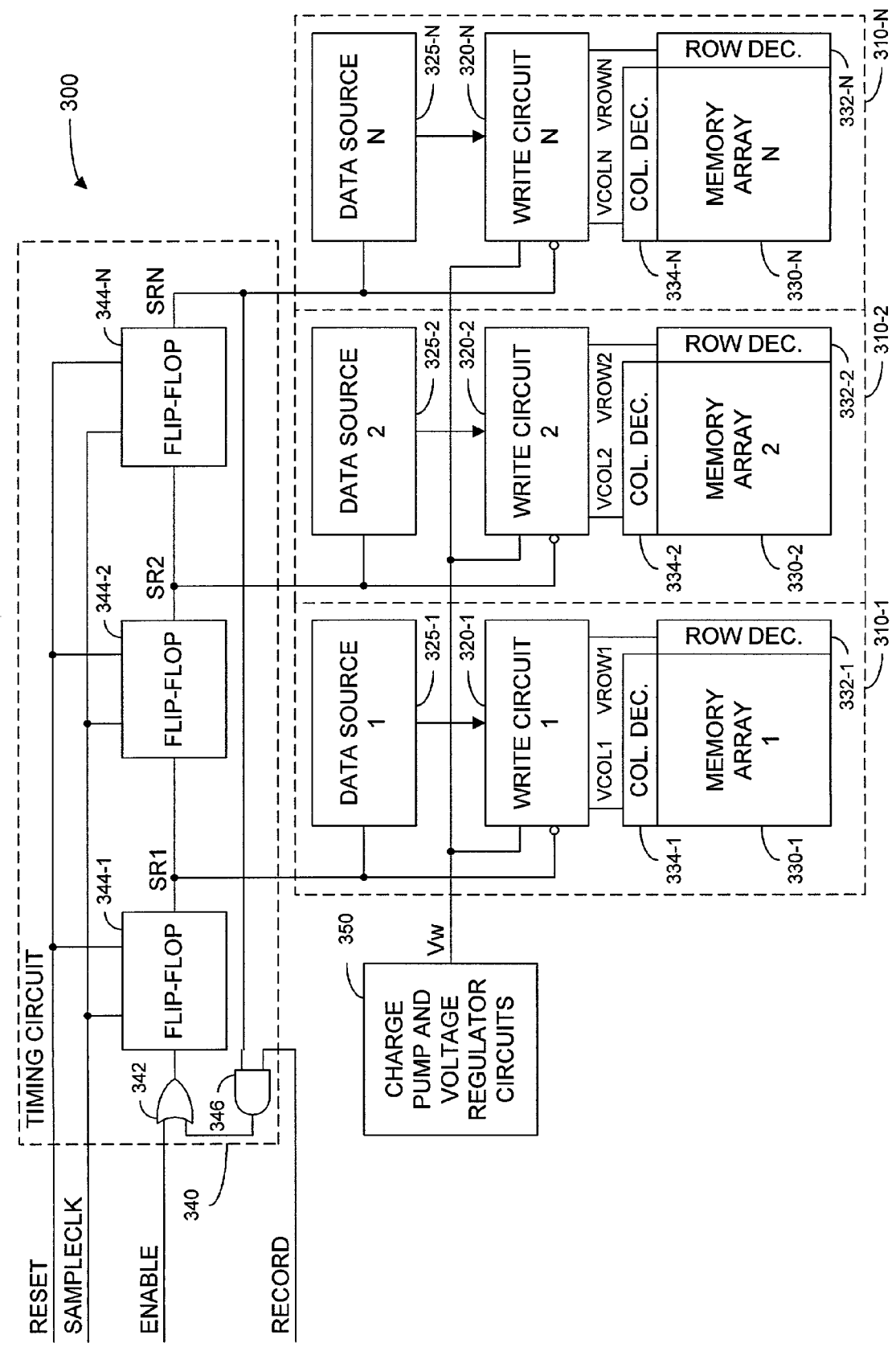
FIG. 3 is a block diagram of a non-volatile memory usable for the system of FIG. 2.

FIG. 3 is a block diagram of a non-volatile memory 300 suitable for use in the present invention. Memory 300 includes multiple memory arrays 330-1 to 330-N of Flash memory cells in respective write pipelines 310-1 to 310-N.

Write pipelines 310-1 to 310-N and memory arrays 330-1 to 330-N are sometimes referred to herein as pipelines 310 and arrays 330. Although FIG. 3 shows three pipelines 310, memory 300 can include any number N of pipelines. The number of pipelines provided determines the number of programming operations memory 300 conducts at a time and accordingly controls the maximum write frequency or data rate of memory 300. As described more fully below for a pipelined write or recording of data, a timing circuit 340 sequentially starts pipelines 310 on programming operations, and pipelines 310 operate individually to complete the programming operations.

Each non-volatile memory array 330 can be a conventional non-volatile memory array. Such memory arrays are known for storing an analog or multi-bit digital value in each memory cell. Arrays 330 include rows and columns of memory cells, where each memory cell is, for example, a single floating gate transistor, a split gate transistor, or a multiple-transistor memory cell. In one embodiment, memory 300 is a flash EEPROM, and each memory cell consists of a single N-channel floating gate transistor. Other memory architectures are also suitable. Control gates of the memory cells in a row of an array 330 are coupled to a row line associated with the row. Drains of the memory cells in a column of an array 330 are coupled to a column or bit line associated with the column, and sources of the memory cells in a sector of an array 330 are coupled to a source line associated with the sector. In one embodiment, each sector contains multiple columns of memory cells, but alternative memory architectures use different kinds of sectors, for example, sectors containing one or multiple rows of memory cells.

Memory arrays 330 are separate in that a programming operation in one array 330 does not directly affect programming operations in other arrays 330. Each memory array 330 has a row decoder 332 and a column decoder 334. Each row decoder 332 receives a row address signal, selects a row line in the associated array 330, and during a programming operation, conveys bias voltages to the selected row line and unselected row lines in the associated array 330. Each column decoder 334 receives a column address signal, selects a column or bit line in the associated array 330, and conveys bias voltages to the selected column or bit line and unselected column or bit lines in the associated array 330 during write operations.

Memory 300 is capable of performing two types of write operations. The first type, referred to herein as a pipelined write operation, sequentially starts programming operations in pipelines 310-1 to 310-N and ends when the programming in memory array 330-N is complete. The second type of write operation, referred to herein as a recording operation, cyclically starts programming operations in pipelines 310-1 to 310-N and continues until after a signal RESET is asserted to stop the recording. In general, the pipelined write operation stores a fixed amount of data in arrays 330, and a recording operation stores a continuous data stream of variable length in memory arrays 330.

Timing circuit 340 starts and controls pipelined write operations and recording operations in pipelines 310. In one embodiment, timing circuit 340 includes N flip-flops 344-1 to 344-N that are connected to operate as a shift register. Flip-flops 344-1 to 344-N respectively correspond to read/write pipeline 310-1 to 310-N and start the corresponding pipelines 310 on programming operations at falling edges of output signals SR1 to SRN.

Write circuits 320-1 to 320-N (sometimes referred to herein as write circuits 320) control programming operations in respective pipelines 310-1 to 310-N. In particular, write circuits 320-1 to 320-N receive respective data values from respective data sources 325-1 to 325-N, and as timing circuit 340 starts each write circuit 320, the write circuit generates programming signals VROW and VCOL that associated row and column decoders 332 and 324 apply to a selected memory cell being programmed in the associated array 330. The structures of write circuits 320 and data sources 325 depend on the type of data values being stored the associated memory array. In one embodiment, memory 300 is an analog memory, and data sources 325-1 to 325-N are sample-and-hold circuits that sample an input analog signal at rising edges of the associated signals SR1 to SRN. U.S. Pat. No. 5,680,341 to Wong et al. describes analog memories with multiple read/write pipelines and describes use of sample-and-hold circuits and write circuits for analog memories.

Figure 4:
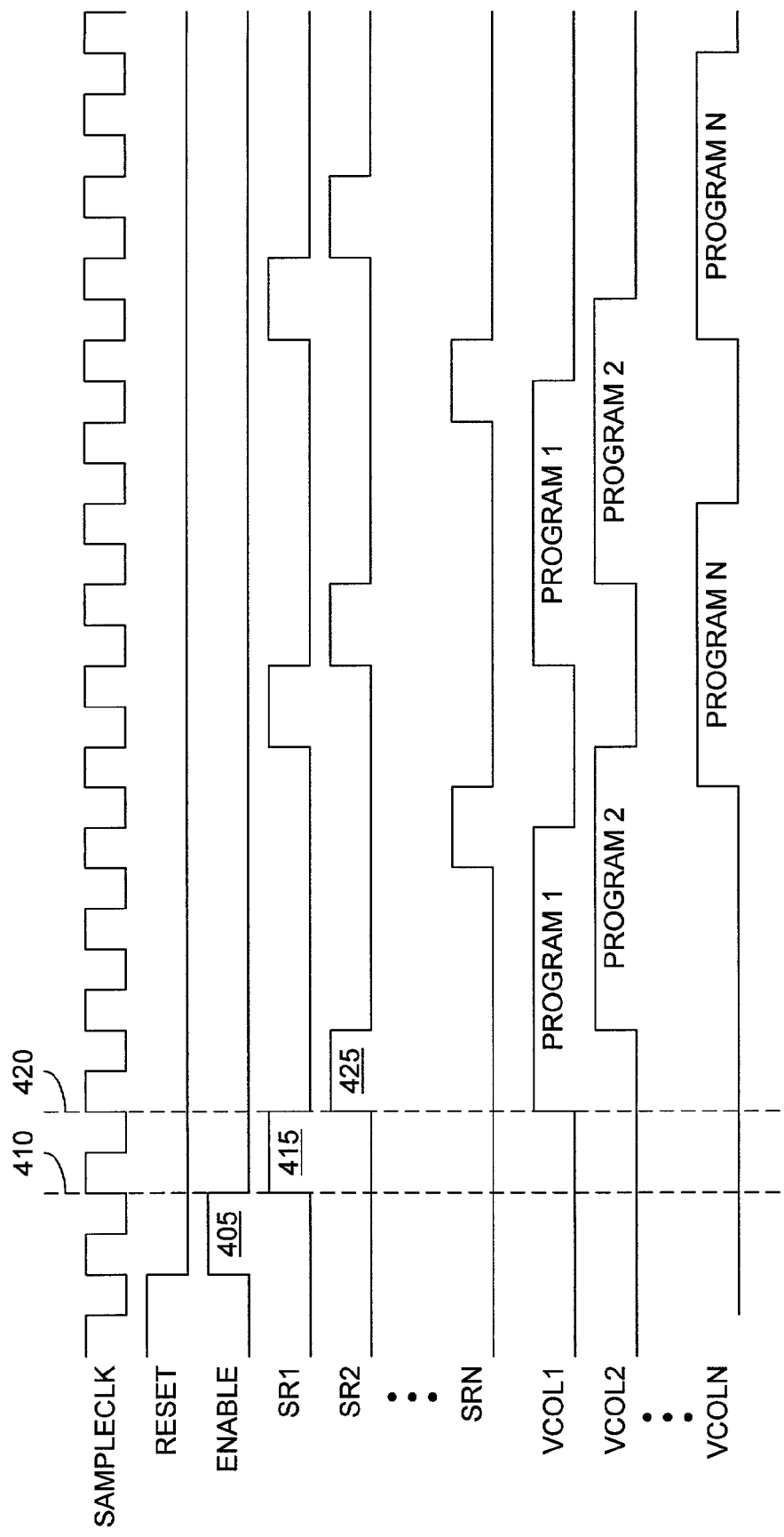
FIG. 4 is a timing diagram for a recording operation performed by the memory of FIG. 3.

A recording operation is equivalent to a series of pipelined write operations where one pipelined write operation starts immediately after the other. FIG. 4 shows a timing diagram for a recording operation in memory 300. To start a recording operation, a signal ENABLE is asserted to an OR gate 342 in timing circuit 340. OR gate 342 has an output terminal coupled to the data input terminal of flip-flop 344-1. At time 410, the rising edge of a clock signal SAMPLECLK causes flip-flop 344-1 to register the high output signal from OR gate 342 and assert signal SR1 high. In some embodiments, the rising edge of signal SR1 activates data source 325-1. For example, in an analog memory, a sample-and-hold circuit in data source 325-1 can sample an analog input signal in response to the pulse 415 in signal SR1.

At a time 420, signal SAMPLECLK triggers flip-flops 344-1 to 344-N. Flip-flop 344-1 deasserts signal SR1, and flip-flop 344-2 asserts signal SR2. The falling edge of signal SR1 starts write circuit 320-1 on a programming operation that writes the data value from data source 325-1 to the selected memory cell in memory array 330-1. The rising edge of signal SR2 activates data source 320-2 which makes the next data value available to write circuit 320-2. With each consecutive rising edge of signal SAMPLECLK, another write circuit 320 and another data source 325 are activated. For the recording operation, signal RECORD is asserted so that an AND gate 346 passes signal SRN via OR gate 342 to the data input of flip-flop 325. Accordingly, timing circuit 340 asserts signal SR1 the sample clock cycle after asserting signal SRN. The frequency of clock signal SAMPLECLK depends on the required write time and is such that a programming operation started in any of the pipelines 310 completes in less than N clock cycles of signal SAMPLECLK. The recording operation continues cyclically starting programming operations in this fashion until a signal RESET is asserted or signal RECORD is deasserted and a last programming operation begins in pipeline 310-N.

Figure 5:
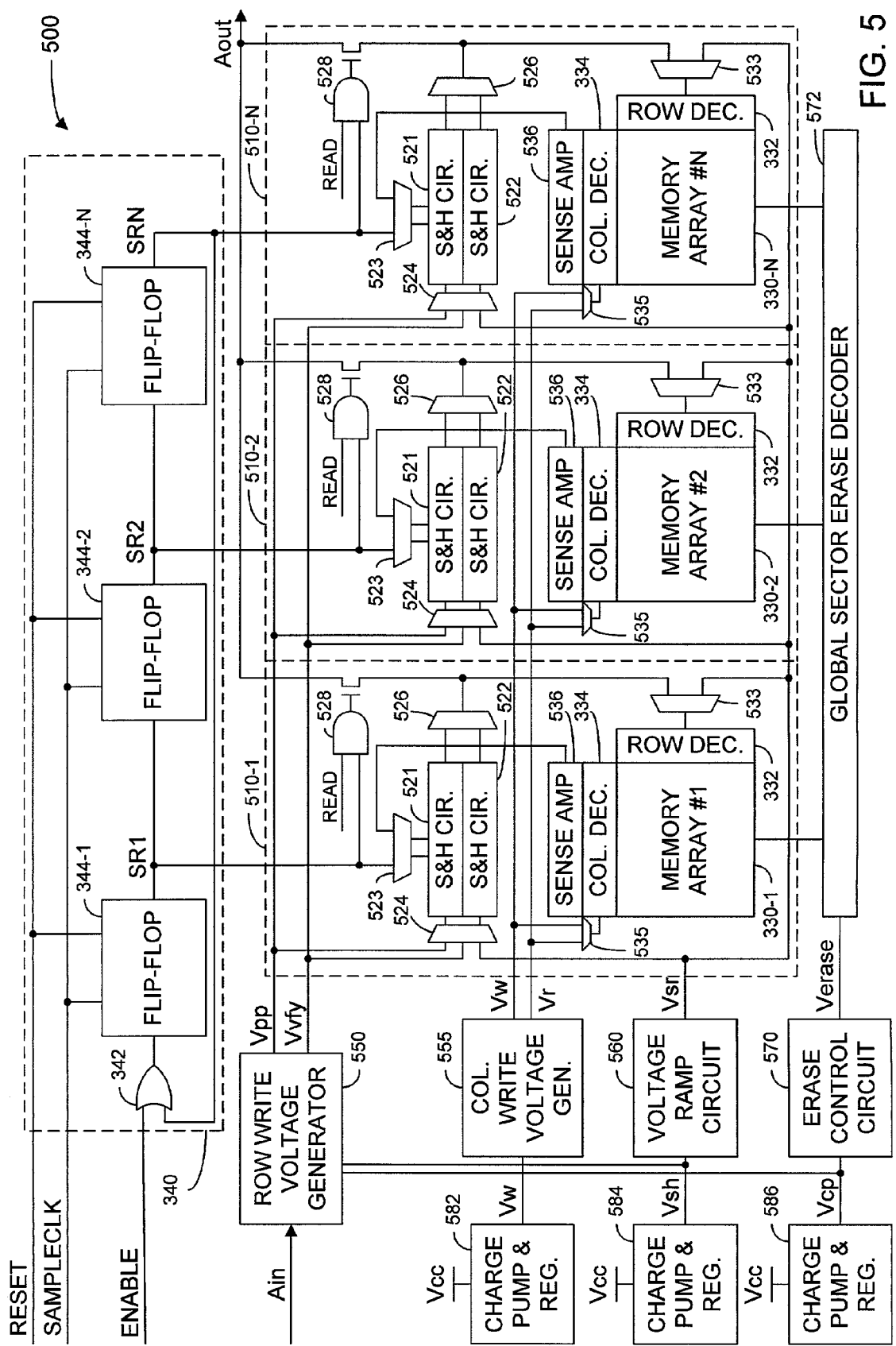
FIG. 5 is a block diagram of an analog/multi-level memory usable for the system of FIG. 2.

FIG. 5 is a block diagram of a non-volatile analog memory 500 in accordance with an embodiment of the invention. Memory 500 includes multiple arrays 330-1 to 330-N of non-volatile memory cells in respective read/write pipelines 510-1 to 510-N. Arrays 330-1 to 330-N are non-volatile memory arrays as described above in regard to FIG. 3, and each memory array 330 has a row decoder 332 and a column decoder 334 as described above. Additionally, each array 330 has a sense amplifier circuit 536, which may contain multiple sense amplifiers. Column decoders 334 also connect associated sense amplifier circuits 536 to the associated memory arrays 330 for read operations and for verify operations when writing to an array 330. Sense amplifier circuits and row, column, and erase decoders are well known. Output signals from sense amplifier circuits 536 clock or trigger sample-and-hold circuits or other temporary storage circuits and may include circuitry such as a one-shot circuit in addition to conventional sense amplifier circuitry. U.S. Pat. No. 5,687,115, which is hereby incorporated by reference in its entirety, illustrates examples of such circuits.

Memory arrays 330 are separate in that write and read operations in one array 330 do not affect write and read operations in other arrays 330. However, a global sector erase decoder 572 conveys the appropriate bias voltages to source lines for all sectors with the same sector address in arrays 330. For an erase operation, an erase control circuit 570 generates an erase signal Verase (typically about 12 V during an erase) and causes decoder 572 to select one or more sectors in arrays 330. In particular, decoder 572 receives erase signal Verase and one or more address signals identifying one or more sectors selected for erasure. Decoder 572 then applies erase signal Verase to the source lines of the selected sectors and grounds the source lines associated with the unselected sectors. Row decoders 332 ground all of the row lines in the arrays containing one or more of the selected sectors, and column decoders 334 allow all column or bit lines associated with the sectors being erased to float. Erase control circuit 570 uses a voltage generator 586, typically a charge pump with regulator circuits, for generating a high voltage Vcp for erase signal Verase. As described below, erase control circuit 570 shares charge pump 586 with a row write voltage generator 550.

A recording operation or a pipelined write operation sequentially writes a series of values in a number of memory cells. In memory 500, the values written are samples of an analog input signal Ain representing either analog data values or multi-bit digital data values. A playback operation reads and outputs the series of values (or samples from memory 500) to reproduce the recorded sequence (or signal). In one embodiment, memory 500 uses pipelines 510-1 to 510-N in a staggered fashion during playback to provide a high read data transfer rate. An alternative playback operation performs parallel read operations in pipelines 510 and serially shifts out the values read from the memory cells, if necessary to reproduce the timing of an input signal Ain.

In memory 500, row write voltage generator 550 generates two write signals Vpp and Vvfy from input signal Ain. Write signal Vpp provides a programming voltage that write circuitry applies to the control gate of a memory cell during programming to change the threshold voltage of the memory cell. The voltage of write signal Vpp has a one-to-one correspondence with the present level of input signal Ain. Typically, write voltage generator 550 selects a higher voltage level for signal Vpp when a higher threshold voltages is being written. Appropriate selection of voltage for signal Vpp makes programming time for writing a target threshold voltage nearly independent of the target threshold voltage. Thus, the write resolution is uniform across the range of threshold voltages. Write signal Vvfy, which has a voltage corresponding to the target threshold voltage to be written to the memory cell, is used to accurately determine when the target threshold voltage is reached whereupon the programming operation stops. An iterative program-and-verify write process such as described in more detail below minimizes effects of memory cell variation. Alternatively, a timed programming operation stops after a specific time and does not require write signal Vvfy or the circuitry associated with generating or holding signal Vvfy. In this case, one sample-and-hold circuit per pipeline is sufficient.

In one embodiment of memory 500, generator 550 includes voltage shifters that linearly map input signal Ain, which is, for example, in a range from 3 to 6 volts, to signal Vpp in a range from 9 to 12 volts and to signal Vvfy in a range from 3 to 6 volts. Voltage generators for write circuits in analog or multiple-bits-per-cell memories are further described in U.S. Pat. No. 5,687,115. Charge pump 586 supplies voltage Vcp to voltage generator 550 for generation of signal Vpp. A charge pump 584 can supply a voltage Vsh, which is greater than the highest threshold voltage, to voltage generator 550 for generation of signal Vfy.

Column write voltage generator 555 provides a constant voltage signal Vw for driving the drain-to-source current through a memory cell during a programming operation and a constant voltage signal Vr for read and verify operations described below. Typically, signal Vw has a voltage between 5 and 6 volts, and a charge pump and voltage regulator circuit 582 generates signal Vw from a supply voltage Vcc between 3 and 5 volts. Signal Vr typically has a voltage of about 1 to 1.5 volts and can be generated from supply voltage Vcc using a voltage divider.

The write circuitry in each pipeline 510 includes row decoder 332, a row line voltage selection circuit 533, column decoder 334, a column line voltage selection circuit 535, sense amplifier circuit 536, sample-and-hold circuits 521 and 522, and multiplexers 523, 524, and 526. (Sample-and-hold circuits 521 and 522 and multiplexers 523, 524, and 526 are involved in both read and write operations.) Multiplexers 523 and 524 are coupled to sample-and-hold circuits 521 and 522 and respectively select trigger signals and input signals for sample-and-hold circuits 521 and 522. For a write operation, multiplexer 523 selects the output signal of the associated flip-flop 344 (also supplied to 528) to trigger both sample-and-hold circuits 521 and 522, and input selection circuit 524 selects and applies signals Vpp and Vvfy to respective input terminals of sample-and-hold circuits 521 and 522. When the output signal from the associated flip-flop 344 transitions, sample-and-hold circuits 521 and 522 sample and store the current voltages of respective write signals Vpp and Vvfy.

Row voltage selection circuit 533 selects the bias voltage that row decoder 332 applies to the selected row line. During a write operation, row voltage selection circuit 533 selects the voltage from selection circuit 526, and selection circuit 526 alternates between selecting sampled signals Vpp and Vvfy from sample-and-hold circuits 521 and 522 respectively. Row decoder 332 applies the signal VROW from selection circuit 533 to the selected row line and grounds unselected row lines. Column voltage selection circuit 535 selects the bias voltage that column decoder 334 applies to the selected column or bit line. Column decoder 334 allows the voltage on the unselected column or bit lines to float. During a write operation, voltage selection circuit 535 alternates between selecting signal Vw and signal Vr. More specifically, column voltage selection circuit 535 selects signal Vw for application to the selected column or bit line of the associated array 330 when row voltage selection circuits 526 and 533 select the sample of signal Vpp for application to the selected row of the associated array. Column voltage selection circuit 535 selects signal Vr for application to the selected column or bit line of the associated array 330 when row voltage selection circuits 526 and 533 select the sample of signal Vvfy for application to the selected row of the associated array.

Memory 500 uses three internal elevated voltages Vcp, Vsh and Vw which the charge pump and voltage regulation circuits 582, 584, and 586 respectively generate from the supply voltage Vcc. Voltage Vcp is normally a 12–13 volt supply which supports all of the on-chip high-voltage needs, including the generation of the erase voltage Verase and the variable control-gate voltage Vpp. Voltage Vcp is also supplied to sample-and-hold circuits 521 for sampling of signal Vpp for a programming operation. Voltage Vsh is a voltage greater than the highest threshold voltage used in a memory cell and is normally a 7–8 volt supply. Voltage ramp circuit 560 uses voltage Vsh when generating a control-gate voltage signal Vsr for a read operation. Write voltage generator 550 uses voltage Vsh in generating the variable control-gate signal Vvfy for a verify operation. Voltage Vw is normally a 5–6 v supply used for supplying the programming current of the memory cell. Current sourcing requirements for voltages Vcp and Vsh are relatively low since voltages Vcp and Vsh predominantly charge capacitance. Accordingly, charge-pumps 586 and 584 typically require a relatively small area of silicon in an integrated circuit. However, current sourcing requirements of voltage Vw are potentially large. Generally, the current that charge pump 582 must supply depends on the programming current characteristics of the non-volatile memory cell in arrays 330 and the total number of memory cells which need to be programmed at the same time, which in turn is determined by the write data bandwidth requirement.

Figure 6:
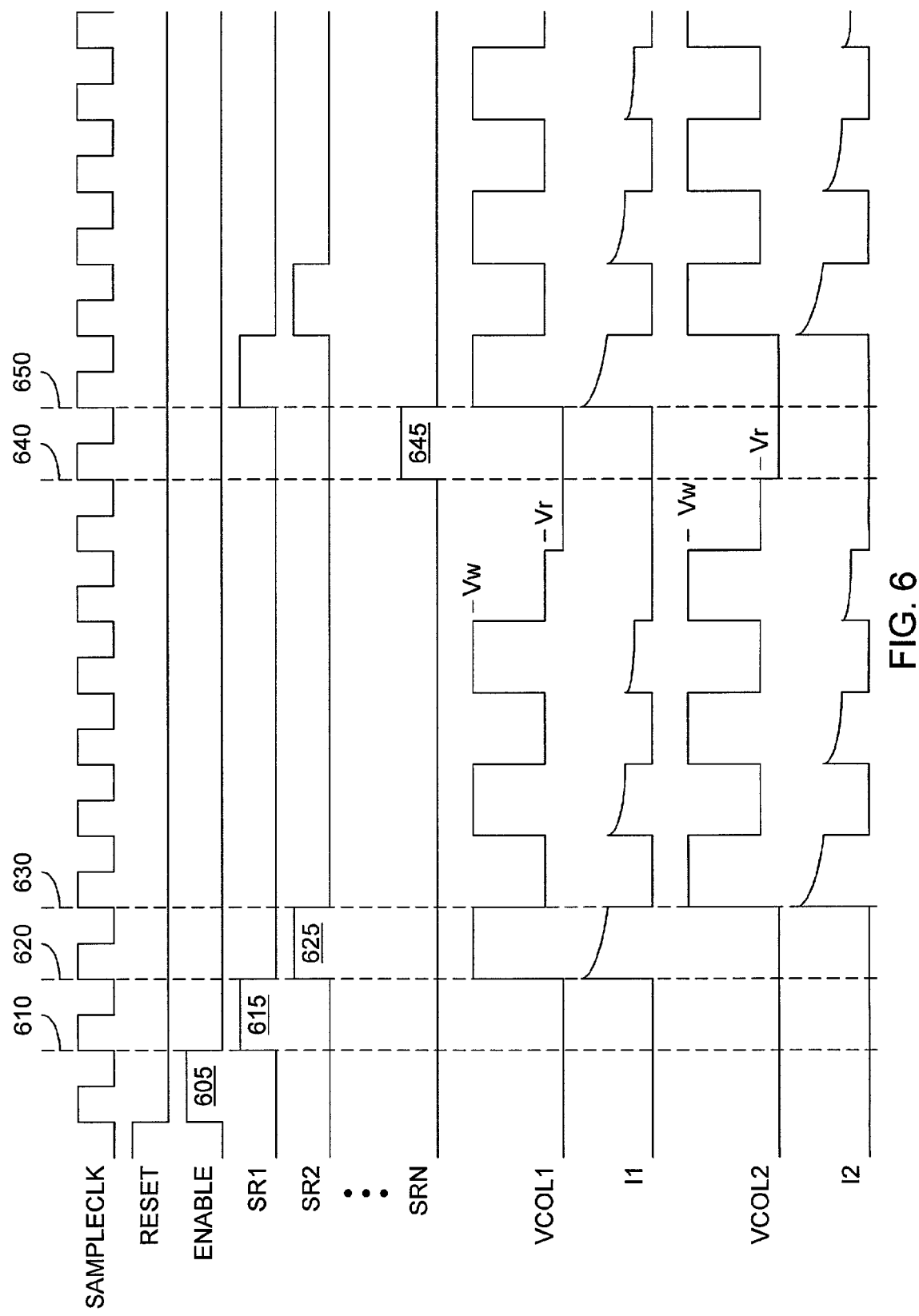
FIG. 6 is a timing diagram for recording operations performed by the memory of FIG. 5.

FIG. 6 shows timing diagrams for a recording process in memory 500. Initially, a signal RESET resets flip-flops 344, and memory arrays 330 are prepared for write operations. For most non-volatile memories such as EEPROM, EPROM, or Flash memory, preparation for a write operation includes erasing storage locations to which information will be written. To start recording, signal RESET is deasserted, and a pulse 605 in an input signal ENABLE to OR gate 342 is asserted high for about one clock cycle of a clock signal SAMPLECLK. OR gate 342 provides enable pulse 605 as the input signal to flip-flop 344-1, and output signal SR1 from flip-flop 344-1 goes high at a rising edge 610 of signal SAMPLECLK. Signal SR1 triggers sample-and-hold circuits 521 and 522 in pipeline 510-1. In response to the next rising edge 620 of sampling clock SAMPLECLK, flip-flop 344-1 deasserts signal SR1, and flip-flop 344-2 asserts signal SR2. A pulse thus propagates through flip-flops 344-1 to 344-N, and signals SR1 to SRN sequentially trigger sample-and-hold circuits 521 and 522 in pipelines 510-1 to 510-N. Each pipeline 510 thus begins sampling write signals Vpp and Vvfy at different times. The last flip-flop 344-N is coupled to an input terminal of OR gate 342 so that signal SR1 is asserted again after signal SRN. The recording process continues starting write operations by cyclically triggering sample-and-hold circuits 521 and 522 until signal RESET stops the pulse from propagating around the ring of flip-flops 344.

During a write, sample-and-hold circuits 521 and 522 in pipelines 510-1 to 510-N sample write signals Vpp and Vvfy in response to the corresponding signals SR1 to SRN. When signal SR1 is asserted at time 610, sample-and-hold circuits 521 and 522 in pipeline 510-1 sample write signals Vpp and Vvfy, and pipeline 510-1 begins writing in a memory cell of array 330-1 a value that signal Ain represented during interval 615. When signal SR2 is asserted at time 620, sample-and-hold circuits 521 and 522 in pipeline 510-2 sample write signals Vpp and Vvfy, and pipeline 510-2 begins writing in a memory cell of array 330-2, a value signal Ain represented during interval 525. Each row voltage select circuits 538 uses the sampled values of the write signals Vpp and Vvfy from multiplexer 526 for a write process that sets the threshold voltage of a selected memory cell to a target threshold voltage. The target threshold voltage is the level that represents the voltage of input signal Ain when write signals Vpp and Vvfy were sampled.

The write process for memory 500 includes generating a series of programming cycles that are interleaved with verify cycles. FIG. 6 shows the example of write processes that start with a programming cycle, but an alternative write process can begin with a verify cycle. During each programming cycle, multiplexer 526 selects the Vpp sample from sample-and-hold circuit 521, and row decoder 332 applies the sampled voltage to a row line selected according to an input address signal identifying a selected memory cell in array 330. Voltage Vpp is typically in the range from 9 to 12 volts. Row decoder 332 grounds unselected row lines. Selection circuit 535 selects voltage Vw during a programming cycle, and column decoder 334 applies voltage Vw to the column or bit line connected to the selected memory cell and grounds unselected column lines. Decoder 572 grounds the source line of the sector containing the selected memory cell. The combination of voltages applied to the control gate, source, and drain of the selected memory cell during a programming cycle causes channel hot electron injection into the floating gate of the selected memory cell and increases the threshold voltage of the selected memory cell.

During a verify cycle, multiplexer 526 selects the vvfy sample from sample-and-hold circuit 522. Row decoder 332 applies the sampled level of signal Vvfy to the selected row line and grounds the unselected row lines. Select circuit 335 selects read voltage Vr, and column decoder 334 applies read voltage Vr and connects sense amplifier 536 to the selected column or bit line. Column decoder 134 grounds the unselected column or bit lines. Decoder 572 continues to ground the source line coupled to the selected memory cell. When the programming cycles raise the threshold voltage of the selected memory cell to the sampled level of signal Vvfy, sense amplifier 536 senses during a verify cycle that the memory cell does not conduct and sends a signal to stop further programming cycles. Programming cycles can be stopped for example, by stopping further applications of sampled voltage Vpp to the selected row line, stopping application of voltage Vw to the selected column line, or both. Thus, the programming cycles raise the threshold voltage to the level of sampled voltage Vvfy and then stop. The available write time for a pipeline 510 is N times the period of clock signal SAMPLECLK where N is the number of pipelines 510. Accordingly, the number of pipelines can be selected according to the required write time per pipeline 510 and the desired write frequency. For example, with a write time Tw of 10 μs, 64 pipelines are required to achieve a sampling rate of 6.4 MHz.

In a recording operation illustrated in FIG. 6, both programming cycles and verify cycles are one clock cycle of signal SAMPLECLK in duration. To achieve this, the frequency of signal SAMPLECLK and the duration of each programming cycle is selected according to the minimum time required for a verify cycle. Additionally, the starts of programming operations are separated by one clock cycle. For example, pipeline 510-1 starts a first programming cycle at a time 620 in response to the pulse 615 in signal SR1 from timing circuit 340. During the programming cycle, the signal VCOL1 applied to the selected column line in array 330-1 is at voltage Vw, and charge pump 582 supplies a current I1 that flows through array 330-1. Current I1 falls during the programming cycle in the characteristic fashion of channel hot electron injection. At time 630, selection circuit 535 in pipeline 510-1 switches signal VCOL1 to read voltage Vr for a verify cycle, and current I1 from charge pump 582 through array 330-1 stops. Also at time 630 when pipeline 510-1 starts the verify cycle, pipeline 510-2 starts a programming cycle in response to pulse 625 on SR2. (Similarly, pulse 645 on SRN is between times 640 and 650). Accordingly, pipelines 510-1 and 510-2 never perform programming at the same time. More generally, only odd numbered pipelines perform programming cycles at the same time as pipeline 510-1, and only even numbered pipelines perform programming cycles at the same time as pipeline 510-2. This effectively cuts the peak current as well as the average current drawn from charge pump 582 in half because at most one half of the pipelines 510 simultaneous performing programming. Additionally, since write operations in pipelines 510 start at different times, most of the programming cycles simultaneously being performed draw much less than the peak programming current for the memory cell. Both factors contribute to significantly reducing the peak total current when compared to a parallel programming operations.

In an alternative embodiment, the duration of a programming cycle can be different from the duration of a verify cycle. Further, the offset between starts of write operations in sequential pipelines can be different from the duration of either a programming cycle or a verify cycle. Staggering the starts of write operations still reduces the peak current when compared to conventional parallel write operations.

For the recording process of FIG. 6, pipelines 510 are effectively partitioned into two banks of pipelines where pipelines in one bank perform programming cycles while pipelines in the other bank perform verify cycles. In other embodiments, pipelines 510 can be partitioned into three or more banks where the pipelines that are in the same bank start programming cycles at the same time, but pipelines in different banks start programming cycles at different times. For example, if a verify cycle is twice the duration of a programming cycle, pipelines 510 can be partitioned into three banks where pipelines in the second bank start programming cycles when programming cycles of pipelines in the first bank end, pipelines in the third bank start programming cycles when programming cycles of pipelines in the second bank end, and pipelines in the first bank start programming cycles when programming cycles of pipelines in the third bank end. Accordingly, only one bank at a time performs programming cycles. This cuts the current from a shared charge pump by two thirds when compared to starting programming operations simultaneously in all of the write pipelines.

Figure 7:
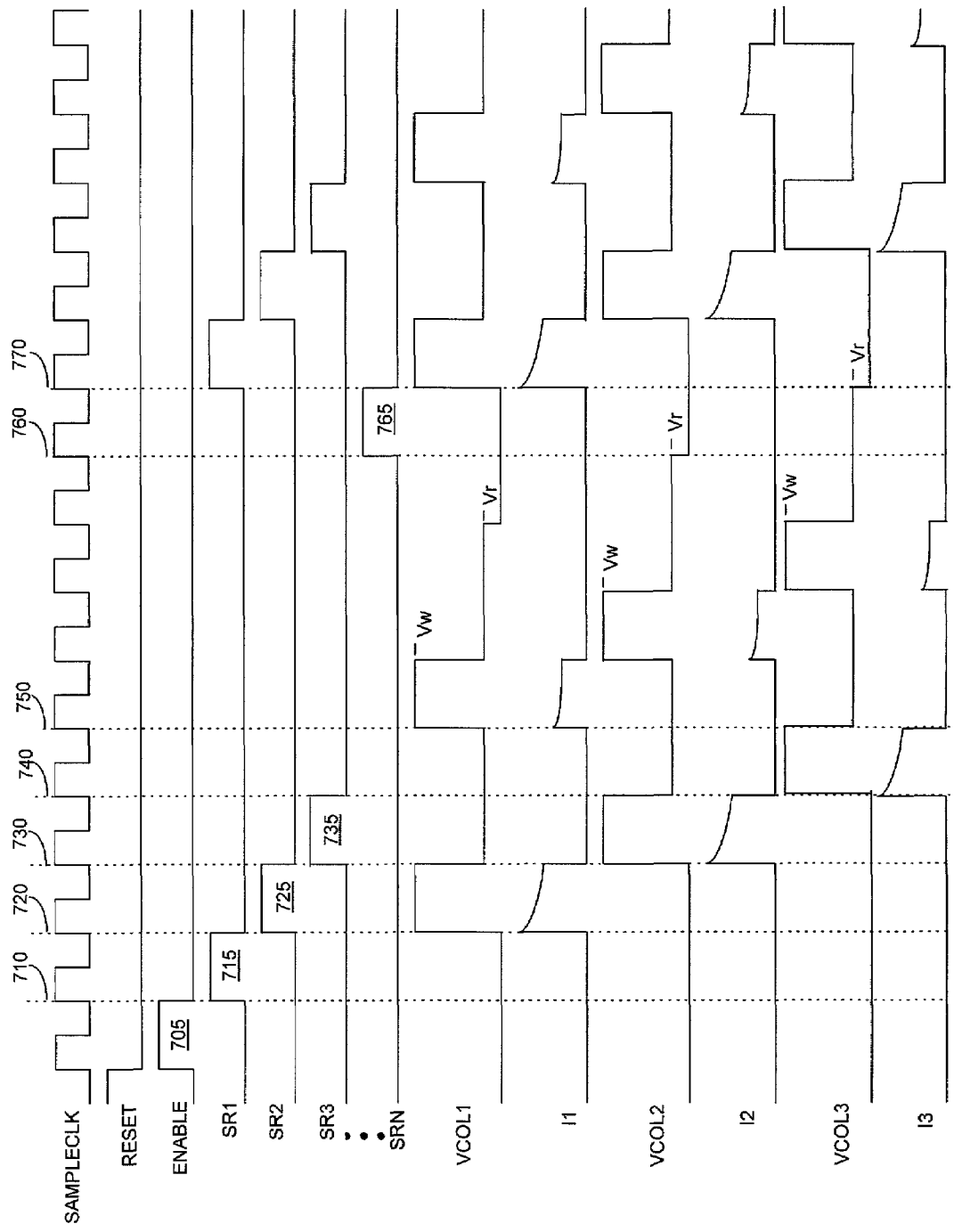
FIG. 7 is a timing diagram for recording operations for another embodiment by the memory of FIG. 5.

A timing diagram for such a recording operation is illustrated in FIG. 7, where programming cycles and verify cycles are one and two clock cycles, respectively, of signal SAMPLECLK in duration. For example, pipeline 510-1 starts a first programming cycle at a time 720 in response to the pulse 715, beginning at time 710 after the ENABLE signal 705 goes low, in signal SR1 from timing circuit 340. During the programming cycle, the signal VCOL1 applied to the selected column line in array 330-1 is at voltage Vw, and charge pump 582 supplies a current I1 that flows through array 330-1. Current I1 falls during the programming cycle in the characteristic fashion of channel hot electron injection. At time 730, selection circuit 535 in pipeline 510-1 switches signal VCOL1 to read voltage Vr for a verify cycle, and current I1 from charge pump 582 through array 330-1 stops. Also at time 730 when pipeline 510-1 starts the verify cycle, pipeline 510-2 starts a programming cycle in response to pulse 725 in signal SR2. At time 740, selection circuit 535 in pipeline 510-1 maintains signal VCOL1 at read voltage Vr to keep array 330-1 in the verify cycle and prevents current I1 from flowing through array 330-1, selection circuit 535 in pipeline 510-2 switches signal VCOL2 to read voltage Vr to start a verify cycle in array 330-2 and stop current I2 from flowing through array 330-2, and selection circuit 535 in pipeline 510-3 starts a programming cycle in response to pulse 735 in signal SR3. At time 750, a programming cycle is started in array 330-1, the verify cycle is maintained in array 330-2, and a verify cycle is started in array 330-3. (Similarly, pulse 765 on SRN is between times 760 and 770.) Accordingly, only one out of three pipelines is performing programming cycles, while the other two out of three pipelines are performing verify cycles.

A similar technique can be used when the programming cycles are twice as long as the verify cycles. In this case, two banks at a time are performing programming cycles, while one bank is performing verify cycles, which reduces current by one third. Other partitions of pipelines 510 into banks and staggering of the starts of programming cycles for the banks can be selected according to the ratio of the duration of a programming cycle to the duration of a verify cycle. Additionally, as described above, pipelines within a bank can start programming operations at different times so that at most one pipeline at a time is performing the first programming cycle of a write operation.

Using a high density, high speed analog/multilevel memory array, such as described above in FIGS. 3–7, for the analog/multi-level memory 210 of FIG. 2, the very high bandwidth and sampling rate requirements for digital applications, such as digital still cameras, can be met. Thus, an analog/multi-level memory having a density of about 50 Mbits can store up to 25 frames at 2M pixels/frame. If the data rate of the image sensor is 10 MHz, such a DSC system will allow a burst rate of up to 5 frames/sec with a total capture time of up to 5 seconds. These and other suitable analog memory systems allow large amounts of analog data to be quickly stored and retrieved, thereby allowing high speed image capture to be sustained for extended periods of time. Furthermore, memories described herein are small size with low power consumption, which decreases the cost and size of the imaging system. Consequently, a DSC capable of high speed image capture becomes practical for the typical consumer.

Referring back to FIG. 2, analog interface circuits 220 coupled to the analog/multi-level memory 210 can be used to access the desired stored analog data from memory locations in the memory 210. Analog interface circuits 220 can include a control circuit for selecting, routing, and buffering the data to desired analog destinations (e.g. analog printer 240, analog display 230, removable analog/multi-level memory 280) or to A/D converter 120 for subsequent routing to digital destinations. Analog image data from pre-processing circuitry 115 can also be transferred directly to an analog display or printer for real-time images or directly to A/D converter 120 for conversion to digital data when the system is not in a burst mode, thereby bypassing analog/multi-level memory 210.

However, when a burst mode is initiated, analog/multi-level memory 210 has the density and write speed to store the large amounts of analog image data from the series of images. Then, due to the high read speed of the memory 210, interface circuits 220 can quickly transfer the desired analog image data to A/D converter 120 for conversion to a digital format and then to subsequent processing circuitry, such as image processor and compressor 130 for image processing and compression. As a result, high speed image capture for extended durations (up to 5 seconds or more) is possible because the high power requirements and slow processing times of image processing and compression no longer limit the rate of the burst mode or how long the burst mode can be sustained. The extent of the duration is dependent on various factors such as the number of pixels/frame, the data transfer rate of the image sensor, and the analog/multi-level memory density. The present invention provides a high density, high speed analog/multi-level memory which can store and hold the burst image data, and then transfer desired portions of the data to image processing and compression circuits when the circuits are available for processing. Once the image data is transferred or used, memory becomes available (e.g., by erasing or writing over data) in the analog/multi-level memory so that additional pictures or video can be captured and stored.

After processing, the digital data can then be transferred, via digital interface circuits 265, to LCD display 155 and/or smaller removable memory cards, such as for digital still cameras. With digital still cameras, image sensor 110, pre-processing circuitry 115, analog/multi-level memory 210, interface circuits 220 and 265, A/D converter 120, image processor and compressor 130, LCD display 155, and other elements are typically embedded within the body 201 of a digital still camera. A separate removable digital memory 285, such as a small Flash memory card conforming to Sandisk's Compact Flash, Toshiba's Smart Media Card, Sony's Memory Stick standard, or any other suitable standard, can be used to store image data so that the stored data is portable and can be more easily processed to reconstruct the stored images. Therefore, using such a system, images of 1 Mpixel/frame or more can be captured at a high burst rate (e.g., 5 frames/sec or more) for long periods of time (e.g., up to 5 seconds or more) and then recorded for reproduction in removable memory cards.

The digital data can also be transmitted to other digital destinations via digital interface circuits 265. For example, the digital data can be transmitted and stored in a PC hard disk drive 275, which can then be accessed for a digital display 260, a digital printer 261, a software editing 262, or transmission through the Internet 255. The digital data can also be transmitted to NTSC/PAL encoders 270 for transforming the digital data into an analog television format, e.g., NTSC, for use by an appropriate television receiver 250, or to various locations of kiosk/print clubs 271 for obtaining "on-the-spot" color pictures 272, for storage for later retrieval 273, and for review on large LCDs 274. These kiosks are PC-based and are connected to a central file server, allowing them to be used for reviewing, editing, and obtaining color pictures "on the spot" or downloading image information to a personal account for later retrieval for new pictures. Once the image data in analog/multi-level memory 210 is released or used, additional pictures or video can be taken since additional memory in the analog/multi-level memory 210 is made available, i.e., by erasing or writing over previously stored data.

Figure 8:
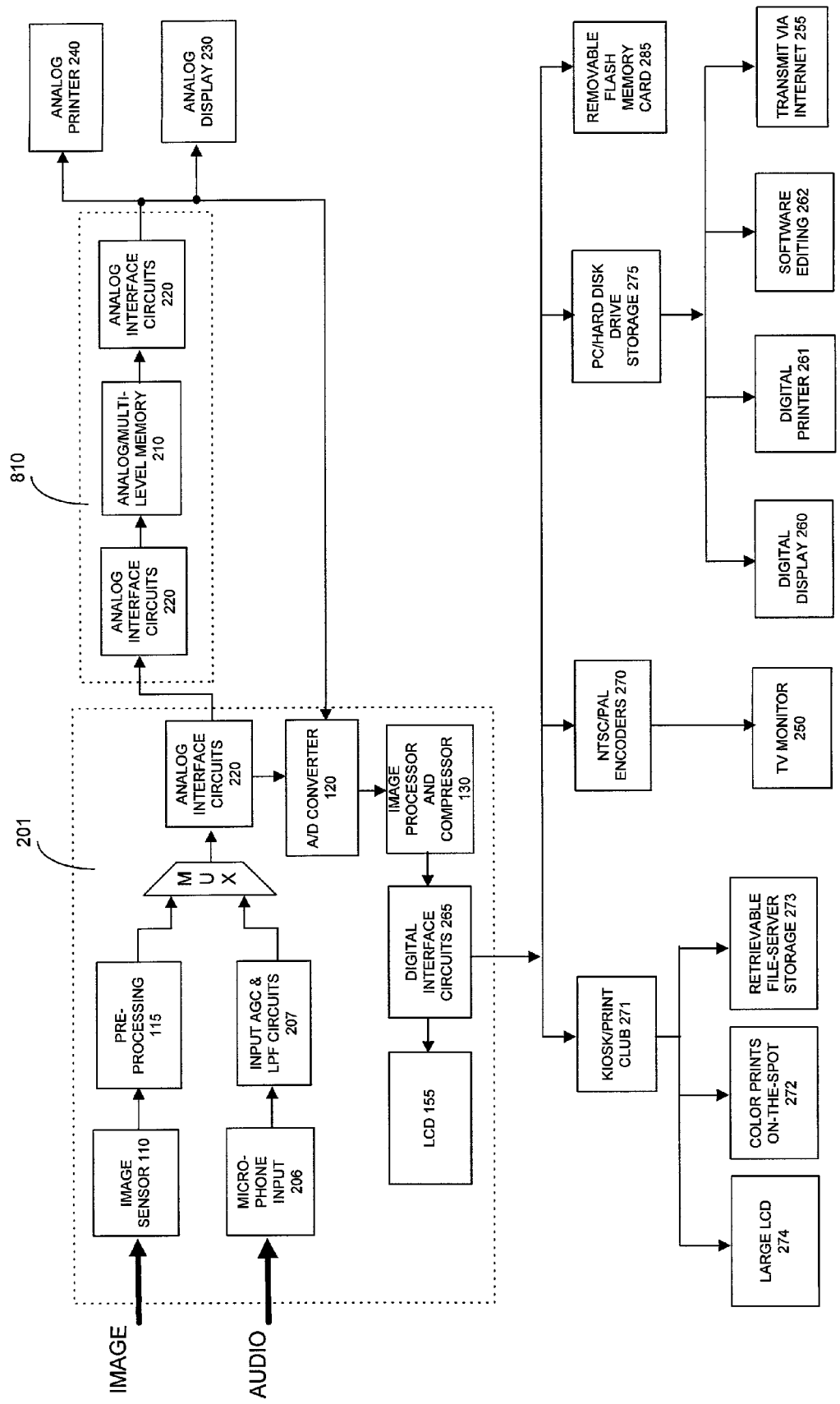
FIG. 8 is a block diagram of a digital imaging system according to another embodiment of the present invention.
Figure 9:
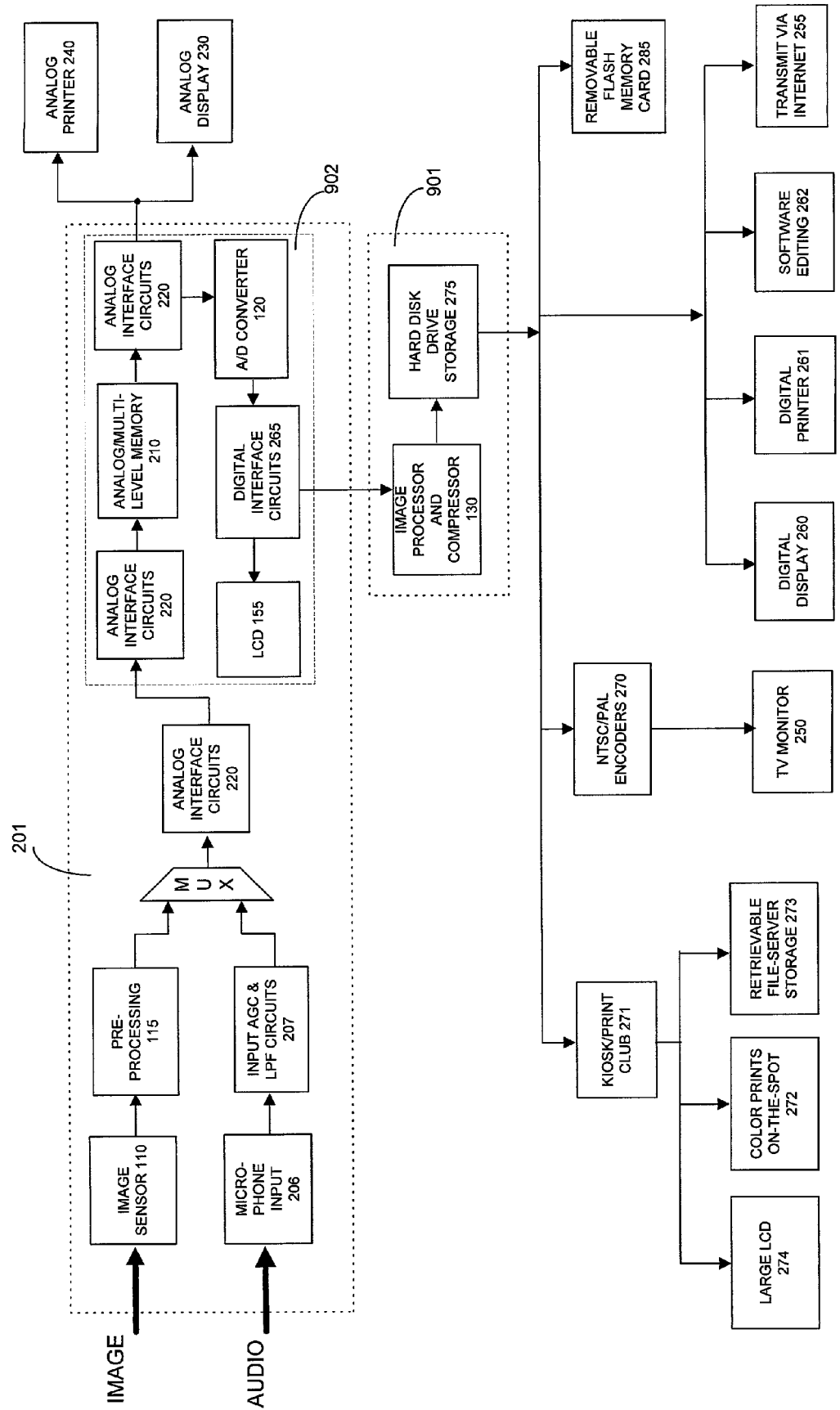
FIG. 9 is a block diagram of a digital imaging system according to yet another embodiment of the present invention.
Figure 10:
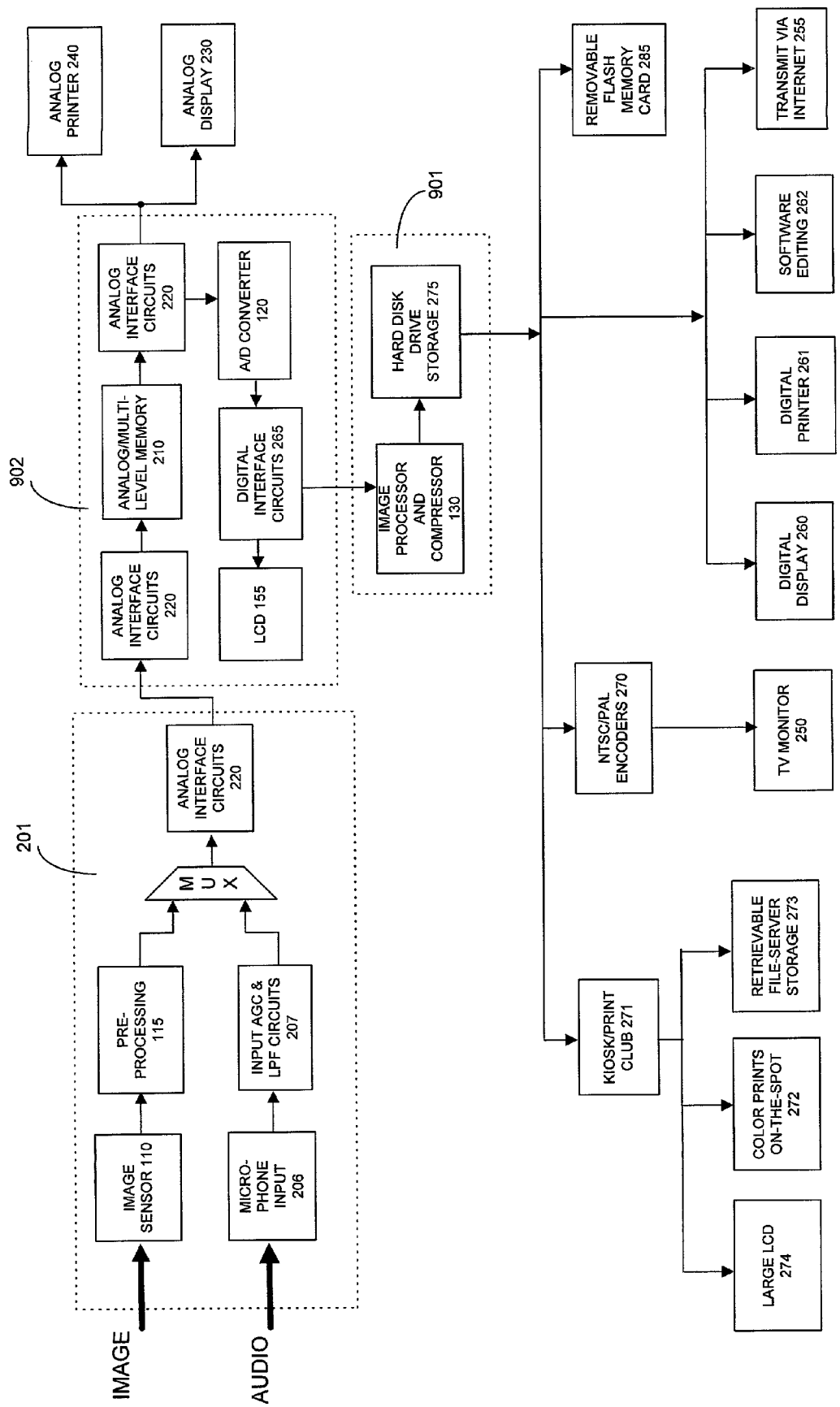
FIG. 10 is a block diagram of a digital imaging system according to still another embodiment of the present invention.

In another embodiment, shown in FIG. 8, analog/multi-level memory 210 is removed from the body 201 of a digital still camera and placed in a removable analog memory card 810, external to the camera. Image processing and compression can then take place within the camera, as before (FIG. 8), or outside the camera, e.g., in a PC 901 through suitable image processing and compression software 130 and storage 275 (FIGS. 9 and 10). If the image processing occurs outside the camera (FIGS. 9 and 10), an analog memory card 902 with A/D conversion 120 and digital interface circuits 265 can be used to download the stored image data into the PC 901. The analog memory related circuit blocks 902 can be either embedded in the body 201 of the DSC (FIG. 9) or be integrated as a separate and removable card (FIG. 10). Software in the PC 901 performs JPEG or other image processing and compression, which reduces the image data to a desired format for storage in a hard disk or other digital destinations. This approach shifts the burden of JPEG and image compression to the PC, which greatly simplifies the design of the DSC, thereby resulting in a substantial reduction in cost, complexity, power consumption, and board space. Thus, the concepts shown in FIGS. 9 and 10, and especially FIG. 10, can be used to make digital cameras disposable, which are both practically and economically feasible. Alternatively, an imaging system can eliminate A/D conversion so that bursty images stored in the removable analog memory can be transmitted to and reproduced directly in analog display devices. Such an imaging system can also be configured to accept a digital memory card, which accesses the analog data from the pre-processing circuitry and performs A/D conversion and image processing and compression within the card for digital displays.

Because of the high density and high read and write speeds of the analog/multi-level memory, analog/multi-level memory 210 can be used to record video images, as well as still images. Analog image data from pre-processing circuitry 115 can be transmitted to an NTSC/PAL interface circuit, either inside or outside the digital camera, for conversion to the proper format and then stored in analog/multi-level memory 210 until desired. Thus, short videos (e.g., less than one minute) can be stored for later display for uses such as promotional advertising, etc. Longer videos are possible with higher density memories 210. Alternatively, analog image data stored in memory 210 from pre-processing circuitry 115 can be held in memory until ready for video display. Then, an NTSC/PAL interface can access the stored image data for conversion to a video format.

The above-described embodiments of the present invention are merely meant to be illustrative and not limiting. It will thus be obvious to those skilled in the art that various changes and modifications may be made without departing from this invention in its broader aspects. For example, even though much of the preceding discussion was aimed at digital imaging applications for a digital still camera with the analog/multi-level memory embedded within the camera, other applications in which a high-speed, high density analog/multi-level memory are also possible. Furthermore, various combinations of image processing systems are possible with the analog/multi-level memory both embedded and external to the system. Additionally, although the above-described embodiments of the invention employ two-dimensional optical sensors for imaging, analog buffers in accordance with the invention are not limited to imaging or use with such sensors. More broadly, the analog buffers can be employed with any analog sensors including but not limited to temperature sensors, positional sensors, acoustic sensors, ultraviolet sensors, and high energy sensors. The appended claims encompass all such changes and modifications as fall within the true spirit and scope of this invention.

We claim:

1. A digital imaging system comprising:
    an image sensor;
    image processing and compression circuits; and
    an analog/multi-level memory coupled between said image sensor and said image processing and compression circuits to receive and temporarily store analog data from said image sensor and transmit said analog data to said image processing and compression circuits, wherein said memory comprises:
        a plurality of odd numbered write pipelines and a plurality of even numbered write pipelines, each write pipeline comprising:
            an array of non-volatile memory cells; and a write circuit coupled to the array, wherein when started on a programming operation for a selected memory cell in the array, the write circuit applies a first voltage to the selected memory cell to drive a current through the selected memory cell, wherein when an odd numbered pipeline and an even numbered pipeline are both performing programming operations, a selection circuit in the odd numbered pipeline selects the first voltage when a selection circuit in the even numbered pipeline selects a second voltage and a selection circuit in the odd numbered pipeline selects the second voltage when the selection circuit in the even numbered pipeline selects the first voltage.

2. The system of claim 1, wherein said memory receives said data at a rate of greater than 10 Mbits/sec for more than 5 seconds and stores more than 50 Mbits of said data.

3. The system of claim 2, wherein the memory is an analog memory.

4. The system of claim 1, wherein said analog data comprises image data.

5. The system of claim 1, wherein said image processing and compression circuits comprise an analog-to-digital (A/D) converter.

6. The system of claim 5, wherein said image processing and compression circuits further comprise an image compressor.

7. The system of claim 6, wherein said image sensor, image processing and compression circuits, and memory comprise a digital still camera.

8. The system of claim 7, wherein said memory is contained in a removable memory card.

9. The system of claim 8, wherein said A/D converter is contained in said removable memory card.

10. The system of claim 7, wherein said image processing and compression circuits are contained within the body of said digital still camera.

11. The system of claim 7, wherein said image processing and compression circuits are not embedded within the body of said digital still camera.

12. The system of claim 7, wherein said image sensor, image processing and compression circuits, and memory are contained within the body of said digital still camera.

13. The system of claim 1, wherein said memory transmits portions of said data when said image processing and compression circuits are available for processing said data.

14. The system of claim 1, wherein the timing circuit starts programming cycles in one of the odd numbered and even numbered write pipelines when verify cycles start in the other of the odd numbered and even numbered write pipelines.

15. The system of claim 1, wherein said stored analog data is externally accessible.

16. The system of claim 1,
wherein the write circuit applies said first voltage to drive said current through the selected memory cell to change a threshold voltage of the selected memory cell; and
during a verify cycle for the selected memory cell, the write circuit determines whether a threshold voltage of the selected memory cell has reached a target level representing a value being written into the selected memory cell,
the system further comprising:
a charge pump that generates the first voltage from a supply voltage and is coupled to the write circuits to supply the first voltage for the programming cycles; and a timing circuit coupled to start programming cycles in the pipelines, wherein the timing circuit starts programming cycles for the odd numbered write pipelines at times that are different from when programming cycles start in the even numbered write pipelines.

17. A digital imaging system comprising:
an image sensor;
image processing and compression circuits; and
an analog/multi-level memory coupled between said image sensor and said image processing and compression circuits to receive and temporarily store analog data from said image sensor and transmit said analog data to said image processing and compression circuits, wherein said memory receives said data at a rate of greater than 10 Mbits/sec for more than 5 seconds and stores more than 50 Mbits of said data and, wherein said memory comprises:
a plurality of write pipelines each write pipeline comprising:
an array of non-volatile memory cells; and
a write circuit coupled to the array, wherein when started on a programming operation for a selected memory cell in the array, the write circuit applies a first voltage to the selected memory cell to drive a current through the selected memory cell;
a timing circuit coupled to sequentially start programming operations by the write circuits; and
a charge pump that generates the first voltage from a supply voltage and is coupled to the write circuits to supply the first voltage for the programming operations, and
wherein the write pipelines comprise:
a plurality of odd numbered pipelines; and
a plurality of even numbered pipelines,
wherein when an odd numbered pipeline and an even numbered pipeline are both performing programming operations, a selection circuit in the odd numbered pipeline selects the first voltage when a selection circuit in the even numbered pipeline selects a second voltage and a selection circuit in the odd numbered pipeline selects the second voltage when the selection circuit in the even numbered pipeline selects the first voltage.

18. A method for digital imaging, the method comprising:
converting an image into electrical signals;
subsequently storing said image converted into said electrical signals as analog data, wherein storing said image includes:
writing said image data into a first and second plurality of write pipelines each comprising an array of non-volatile memory cells and a write circuit coupled to the array, wherein when started on a programming operation for a selected memory cell in the array, the write circuit applies a first voltage to the selected memory cell to drive a current through the selected memory cell, wherein when one of the first plurality of pipelines and an one of the second plurality of pipelines are both performing programming operations, a selection circuit in the pipeline of the first plurality selects the first voltage when a selection circuit in the pipeline of the second plurality selects a second voltage and a selection circuit in the pipeline of the first plurality selects the second voltage when the selection circuit in the pipeline of the second plurality selects the first voltage; and subsequently transmitting portions of said stored analog data for digital signal processing.

19. The method of claim 18, further comprising pre-processing said electrical signals prior to said storing.

20. The method of claim 18, wherein said analog data is stored at a rate greater than 10 Mbits/sec for more than 5 seconds and in a quantity greater than 50 Mbits.

21. The method of claim 18, wherein said portions are transmitted only when said digital signal processing is available.

22. The method of claim 18, wherein said converting and storing are performed in a digital still camera.

23. The method of claim 18, wherein said storing comprises:
- starting a first programming operation to program a first selected memory cell in a first memory array, wherein the first programming operation includes connecting a charge pump to drive a current through the first selected memory cell and change a threshold voltage in the first memory cell; and
- starting a second programming operation to program a second selected memory cell in a second memory array, wherein the second programming operation includes connecting the charge pump to drive a current through the second selected memory cell and change a threshold voltage in the second memory cell, wherein starting the second programming operation occurs after starting first programming operation but before the first programming operation is complete.

24. The method of claim 18, further comprising:
- accessing said stored analog data in analog form prior to said transmitting.

* * * * *